Dec. 29, 1970 W. MEER ET AL 3,551,220

METHOD OF PRODUCING A TRANSISTOR

Filed Jan. 23, 1967

United States Patent Office 3,551,220
Patented Dec. 29, 1970

3,551,220

METHOD OF PRODUCING A TRANSISTOR

Winfried Meer, Hohenbrunn, and Wolfgang Schembs, Munich, Germany, assignors to Siemens Aktiengesellschaft, a corporation of Germany Filed Jan. 23, 1967, Ser. No. 611,010
Claims priority, application Germany, Jan. 26, 1966, S 101,632
Int. Cl. H01l 7/36, 7/44, 7/46
U.S. Cl. 148—175 6 Claims

ABSTRACT OF THE DISCLOSURE

An improvement in making transistors is described wherein a single mask is used for forming both an etched thin base region and the emitter which comprises indiffusing dopant into the surface of the transistor wafer to produce the base region, coating the base region with an etching mask which is provided with a window extending to the base region, etching a depression into said base region at the location of said window to reduce locally the thickness of the base region and producing at the base of the depression of the base region, an emitter region.

Figures 1, 2, 3, 4, 5, 6, 7, 8, 9, 10, 11, 12, 13:
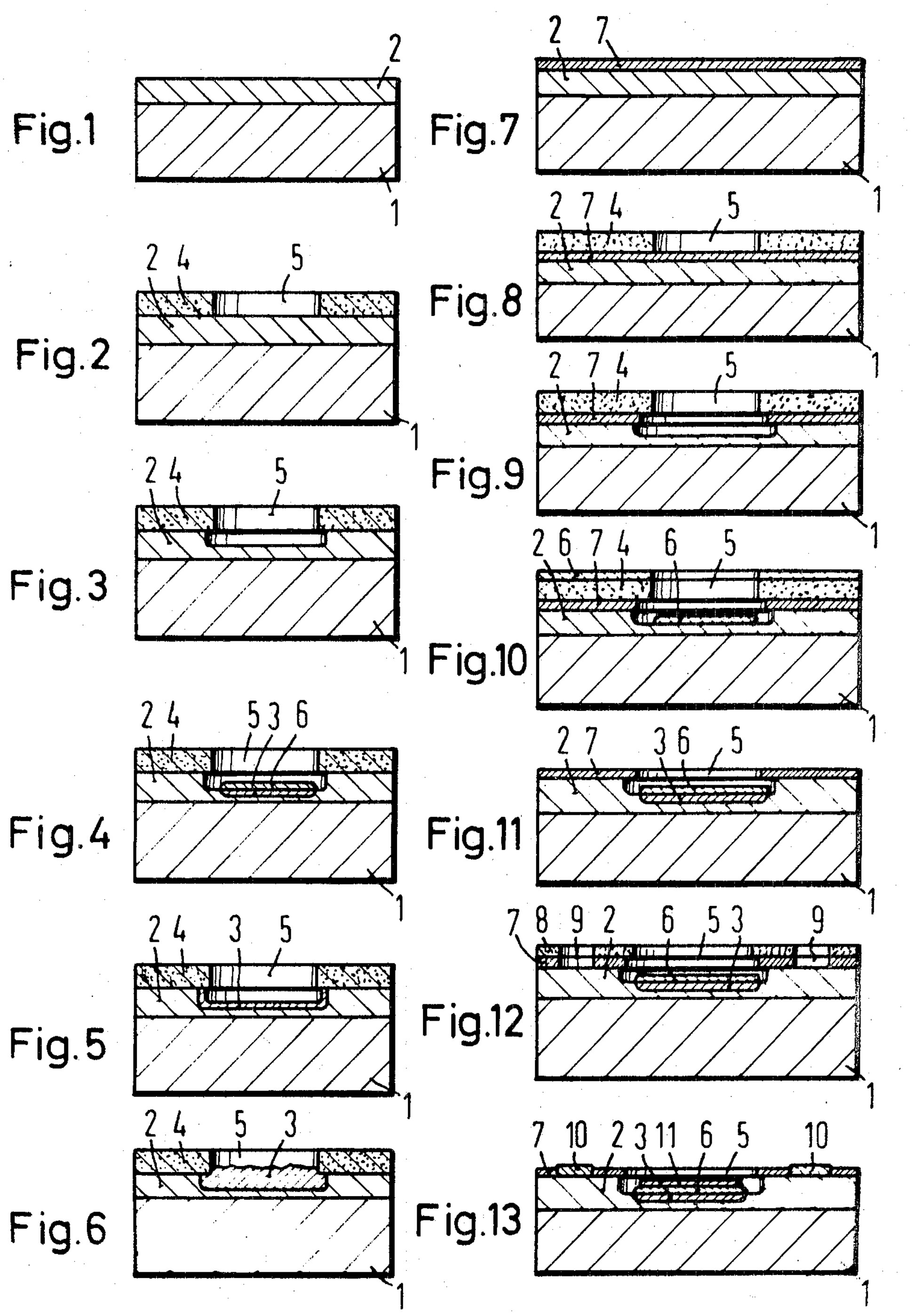

It is known that extremely thin base zones are desirable for high-frequency transistors. On the other hand, a very small base spreading resistance is desired. The base spreading resistance is that resistance of the base region caused by the resistance of the bulk material of the base region. However, in view of the extremely small dimensions of the high-frequency and ultra-high frequency transistors it is very difficult to provide the base region of such transistors with a design or construction which meets both requirements. Our invention has as an object a solution to this problem.

Our invention relates to a method of producing a transistor, whereby a zone of one conductance type is formed by diffusion upon the surface of a semiconductor crystal having the opposite conductance type, and upon this zone a zone of the first conductance type is formed in a known manner. This last zone is separated from the initial material of the semiconductor crystal by at least two p-n junctions. According to the invention, following the production of the oppositely conducting zone, the latter is coated with an etching mask, through which some localities of the zone are exposed. The exposed localities are etched thin. Following the etching process, these localities are provided at least with a doping material which produces the region of the same conductance type.

The production of said zone of first conductivity may be effected by alloying, diffusing or epitactic precipitation from the gaseous phase. In the first two instances, the etched-thin locations are contacted with either only the doping material or with the doping material and a thinned material, for example an auxiliary metal or the semiconductor. In the case of epitactic precipitation, semiconductor material is precipitated together with the doping material from a reaction gas. This precipitation takes place also only at the etched-thin locations and is controlled by masking, which is geometrically equal to the etching mask, except for the thickness. In the simplest case, the etching mask itself is used for the localized application of the doping material, respectively the doped semiconductor material. This possibility, however, is not applicable as desired. But the possibility exists to combine the localized etching process with the simultaneous production of the diffusion mask.

The invention will be further described by specific embodiments with reference to the drawing in which FIGS. 1 to 6 show one embodiment; and FIGS. 7 to 13 show another embodiment.

In the embodiment of FIGS. 1 to 6, the etching mask itself is used as a mask for the localized application of the region of opposite conductivity. For this reason the etching mask must be resistant not only to the etchant used but also to the conditions prevailing during the application of the doping material and even the conditions which prevail during the production of the region of the same conductance type as the initial material. To a certain extent this can be accomplished by an $SiO_2$ etching mask. Generally, a photo-varnish mask is etch-resistant, however it requires that the doping material is applied at low temperatures. When high temperatures are necessary for applying the doping material through diffusion and/or alloying, then the photo-varnish mask must possibly be removed beforehand.

In FIGS. 1 to 6, 1 depicts a monocrystal consisting of silicon or germanium, with p-conductivity, for example. A surface region 2 of opposite conductivity, for example n-type, has been produced in a known manner on the monocrystal through indiffusion from the gaseous phase. As a rule, in the finish transistor the initial material serves as the collector zone, the indiffused surface zone 2 serves as the base zone, and region 3 which is produced at the surface of region 2 and is of the same conductance type as the initial material 1, serves as the emitter. In order to produce the emitter zone 3, an etching mask 4 consisting for example of photo lac and/or of $SiO_2$ is provided with a window 5, extending to region 2, which is produced in a known manner, for example through developing and illuminating the photo lac and/or through 10% potassium hydroxide etching of the $SiO_2$ layer with hydrofluoric acid. The position of the future emitter is determined by this window. This is illustrated in FIG. 2.

The next step is to etch-thin the base diffusion layer 2 in the region of the future emitter. This is accomplished with the use of an etchant which does not attack the etching mask 4, but dissolves the semiconductor. Since such etchants are widely known, an example thereof is unnecessary.

The condition subsequent to the etching-thin is illustrated in FIG. 3. FIGS. 4 to 6 illustrate the following possibilities for adding the material necessary for producing emitter zone 3.

(a) The doping metal which produces the emitter is vapor deposited and alloyed-in. One finds a thin metal layer 6 of the doped alloying material on the etching mask 4 and at the base of the window 5. The p-conducting emitter zone 3 results from alloying. After the excess metal is removed, one has the body seen in FIG. 4. The etching mask 4 may also be removed, if desired. The transistor is in a known manner completed after adding electrodes by any conventional manner.

(b) The material which produces the emitter is indiffused from the gaseous phase. Using mask 4, for example of $SiO_2$, the emitter zone is produced in the manner known from planar technology. The final state is shown in FIG. 5.

(c) The emitter zone is applied through epitaxy. To accomplish this, the semiconductor crystal together with the masking layer 4 is heated to precipitation temperature, in a reaction gas, suitable for the precipitation of the appropriately doped semiconductor layer, to precipitate a thin zone 3 of the same conductance type as the initial material 1, at the base of the window 5. The reaction gas mixture to accomplish this is within the skill of the art and may consist of $SiCl_4$ or $SiHCl_3$ with $H_2$ and suitable dopant, e.g. Al. Subsequently the masking layer and the semiconductor material which possibly adheres thereto may be removed again. The product is seen in FIG. 6.

In all three cases, the transistor is completed through barrier-free contacting of zones 1, 2 and 3 as well as through other known measures. The thicknesses of zones 2 and 3 are respectively, for example, 1.5$\mu$ and 0.2$\mu$. The effective thickness of the base region favorably amounts to approximately 0.5$\mu$.

FIGS. 7 to 13 disclose a variation of the invention. In this variation, a temperature-resistant auxiliary layer 7, for example of $SiO_2$, is first applied to the surface of the diffused zone 2. This is seen in FIG. 7. Thus, the doping material which produces the emitter 3 is prevented from reaching the semiconductor material. The etching masking 4 is applied to this auxiliary layer 7. After the localized etching-thin of the base region 2, which naturally also produces a window in the auxiliary layer 7, the etching mask is removed. This is done prior to or after the application of the material which produces the emitter.

FIG. 8 shows the condition after the application of the auxiliary layer 7 and the etching mask 4 with the etching window 5. The auxiliary layer 7 should be etchable, so that it may be dissolved, for example, by the etchant to be used for etching-thin of the base zone. Preferably, therefore, the auxiliary layer 7 consists of $SiO_2$, while the etching mask is preferably comprised of a photo lac. The production of a photo-lac etching mask is conventional and does not require any detailed comments at this point.

FIG. 9 shows the state following the thin etching of the base zone. FIG. 10 shows the results of a method wherein the emitter material is applied through vapor depositing; the metal layer is again indicated as 6.

After dissolving the etching mask and alloying-in the emitter material, one obtains the emitter zone 3 in a similar manner as with the method described in FIG. 4. This is shown in FIG. 11.

In a similar manner, the emitter zone may also be obtained by diffusion from the gaseous phase (planar technique) and by means of epitaxy. FIGS. 12 and 13 do not show these alternatives, but show further steps for the production of the transistor obtained according to FIG. 11. Thus in FIG. 12 a photo-lac layer 8 is applied on top of the auxiliary layer 7. The photo-lac or varnish layer 8 has windows 9 produced therein for etching off the local auxiliary layer 7. The auxiliary layer 7 is etched through windows 9 down to the semiconductor material of the base zone 3. FIG. 13 shows the possibility of contacting the base zone by metallization 10 as well as contacting the emitter zone by metallization 11.

The heart of our method is in the measure of using a single masking not only for an etching process necessary for forming the base zone, but also for forming the emitter. Thus the structure of the base as well as of the emitter is determined with a masking. This measure eliminates a number of error sources usually occurring in the production of similar transistors and hence makes possible a much bettter reproducibility than the known methods which are used for the production of similar transistors.

We claim:

1. The method of producing a transistor whereby a surface region intended as the base region of the transistor and being of one conductance type is produced by diffusion on one flat side of a wafer-shaped semiconductor crystal of opposite conductance type, which comprises indiffusing dopant into the surface of the crystal to produce the base region, coating the semiconductor wafer with a layer comprised of $SiO_2$, coating the $SiO_2$ layer with an etching mask, etching a window extending to the base region with the aid of an etching mask, etching a depression into said base region at the location of said window to reduce locally the thickness of the base region whereby said depression does not penetrate the base material of the semiconductor crystal and, finally, producing at the base of the depression of the base region, which has a uniform thickness outside said depression, an emitter region, whereby the emitter region does not contact the original material of the semiconductor crystal which is to be used as the collector of the transistor.

2. The method of claim 1, wherein the emitter region is produced by vapor deposition and alloying-in a doping material.

3. The method of claim 1, wherein the emitter region is produced by depositing a doped epitaxial layer.

4. The method of claim 1, wherein the emitter region is produced by indiffusing activator material from gaseous phase into the base of the depression.

5. The method of claim 4, wherein the etching mask is removed after the localized application of activator material.

6. The method of claim 1, wherein excess doping material is removed together with the etching mask bv dissolving the etching mask from its support.

References Cited

UNITED STATES PATENTS

| | | | |
|---|---|---|---|
| 2,947,925 | 8/1960 | Maynard et al. | 148—179 |
| 3,116,184 | 12/1963 | Miller | 148—179 |
| 3,147,152 | 9/1964 | Mendel | 148—187 |
| 3,160,534 | 12/1964 | Oroshnik | 148—179 |
| 3,409,482 | 11/1968 | Lindmayer et al. | 148—175 |

RICHARD O. DEAN, Primary Examiner

U.S. Cl. X.R.

148—33.3, 179, 180, 187, 189